United States Patent [19]

Kaneko

[11] Patent Number: 5,159,208
[45] Date of Patent: Oct. 27, 1992

[54] INTERFACE CIRCUIT PROVIDED BETWEEN A COMPOUND SEMICONDUCTOR LOGIC CIRCUIT AND A BIPOLAR TRANSISTOR CIRCUIT

[75] Inventor: Yoshiaki Kaneko, Yokohama, Japan

[73] Assignee: Fujitsu Limited, Kawasaki, Japan

[21] Appl. No.: 666,619

[22] Filed: Mar. 8, 1991

[30] Foreign Application Priority Data

Mar. 20, 1990 [JP] Japan .................................. 2-70708

[51] Int. Cl.$^5$ ................. H03K 19/0175; H03K 19/20
[52] U.S. Cl. ..................... 307/475; 307/450; 307/443
[58] Field of Search ............... 307/448, 450, 475, 443, 307/544; 326/4874 Y, 4859 W

[56] References Cited

U.S. PATENT DOCUMENTS

| | | | |
|---|---|---|---|
| 4,631,426 | 12/1986 | Nelson et al. | 307/475 |
| 4,701,643 | 10/1987 | Laude et al. | 307/446 |
| 4,743,782 | 5/1988 | Nelson et al. | 307/475 |
| 4,912,745 | 3/1990 | Fitzpatrick et al. | 307/450 |

FOREIGN PATENT DOCUMENTS 0110701 11/1983 European Pat. Off.
1-37827 of 1989 Japan.

OTHER PUBLICATIONS

Patent Abstracts of Japan, vol. 11, #20 (E-472)[2467], Dec. 20, 1987 & JP-A-61 192 123 (Fujitsu Ltd.) 26/8/86 FIG. p.(E-472)[2467].
Patent Abstracts of Japan, vol. 11, #217 (E-523)[2664], Jul. 14, 1987 & JP-A-62 36 918 (Mitsubishi Electric) 17/2/87.

*Primary Examiner*—David Hudspeth
*Assistant Examiner*—Andrew Sanders
*Attorney, Agent, or Firm*—Staas & Halsey

[57] ABSTRACT

An interface circuit provided between a compound semiconductor logic circuit and a bipolar transistor circuit includes an input buffer part for receiving an input signal from the GaAs logic circuit and for outputting a buffered input signal, and an output driver circuit for generating a drive signal from the buffered input signal. The interface circuit also includes an output transistor having a gate connectable to receive the drive signal, a first terminal connectable to receive a first power supply voltage, and a second terminal, and an output terminal connected to the second terminal of the output transistor and the bipolar transistor circuit. Further, the interface circuit includes an output level adjustment circuit which has a first Schottky barrier transistor having a gate, a first terminal connected to the gate of the Schottky barrier transistor and the gate of the output transistor, and a second terminal and which generates a constant voltage applied to the second terminal of the Schottky barrier transistor.

20 Claims, 17 Drawing Sheets

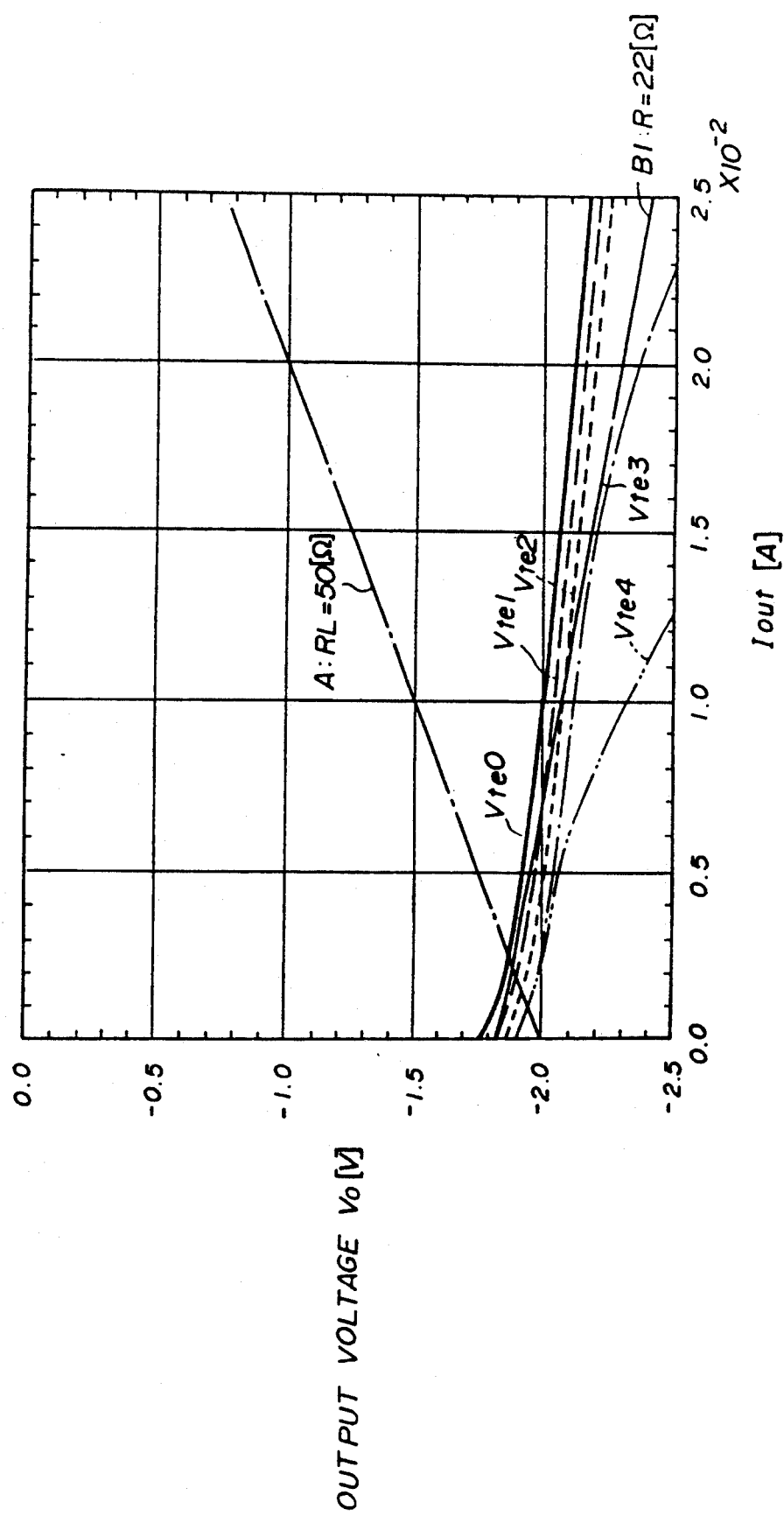

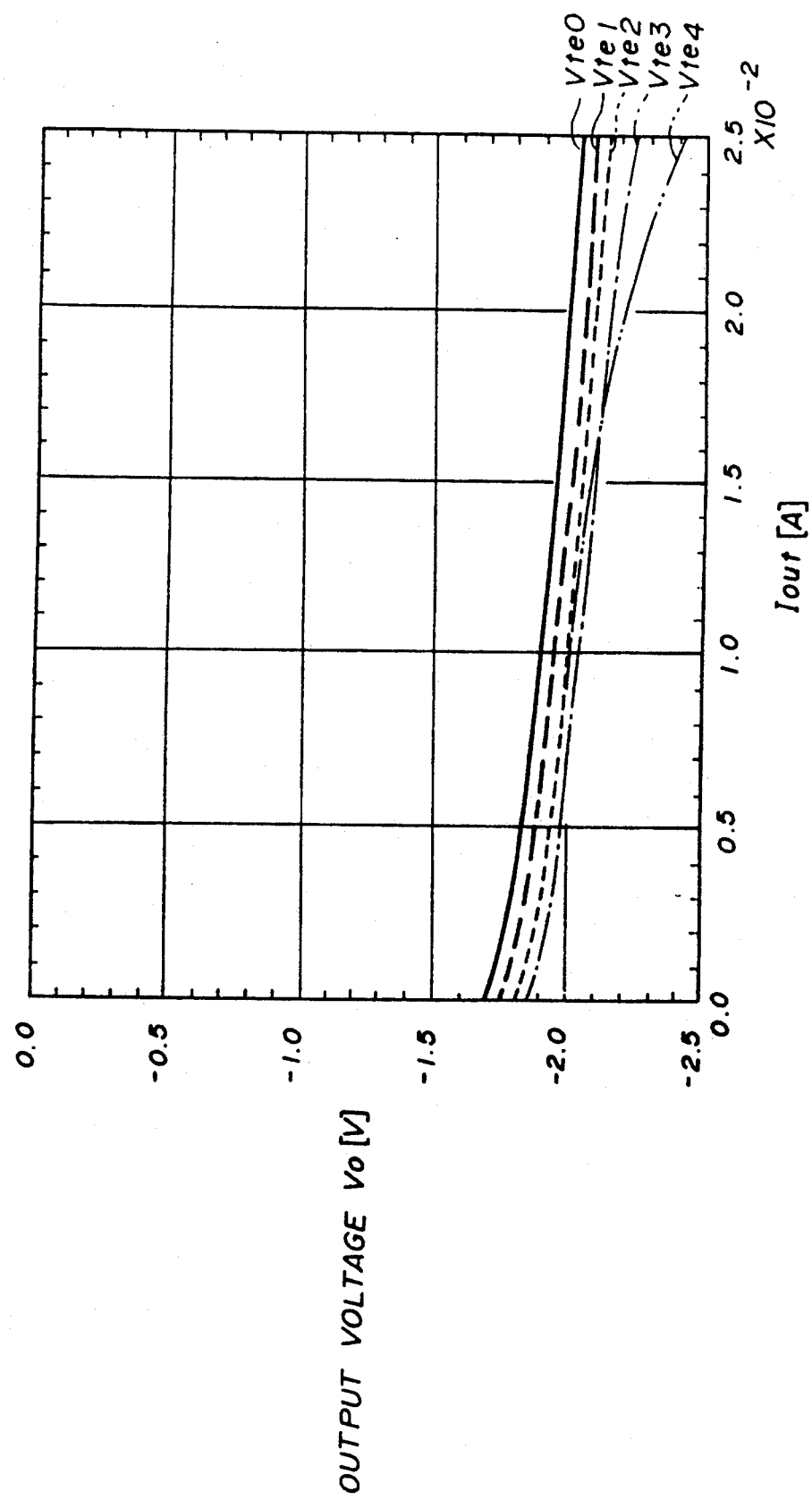

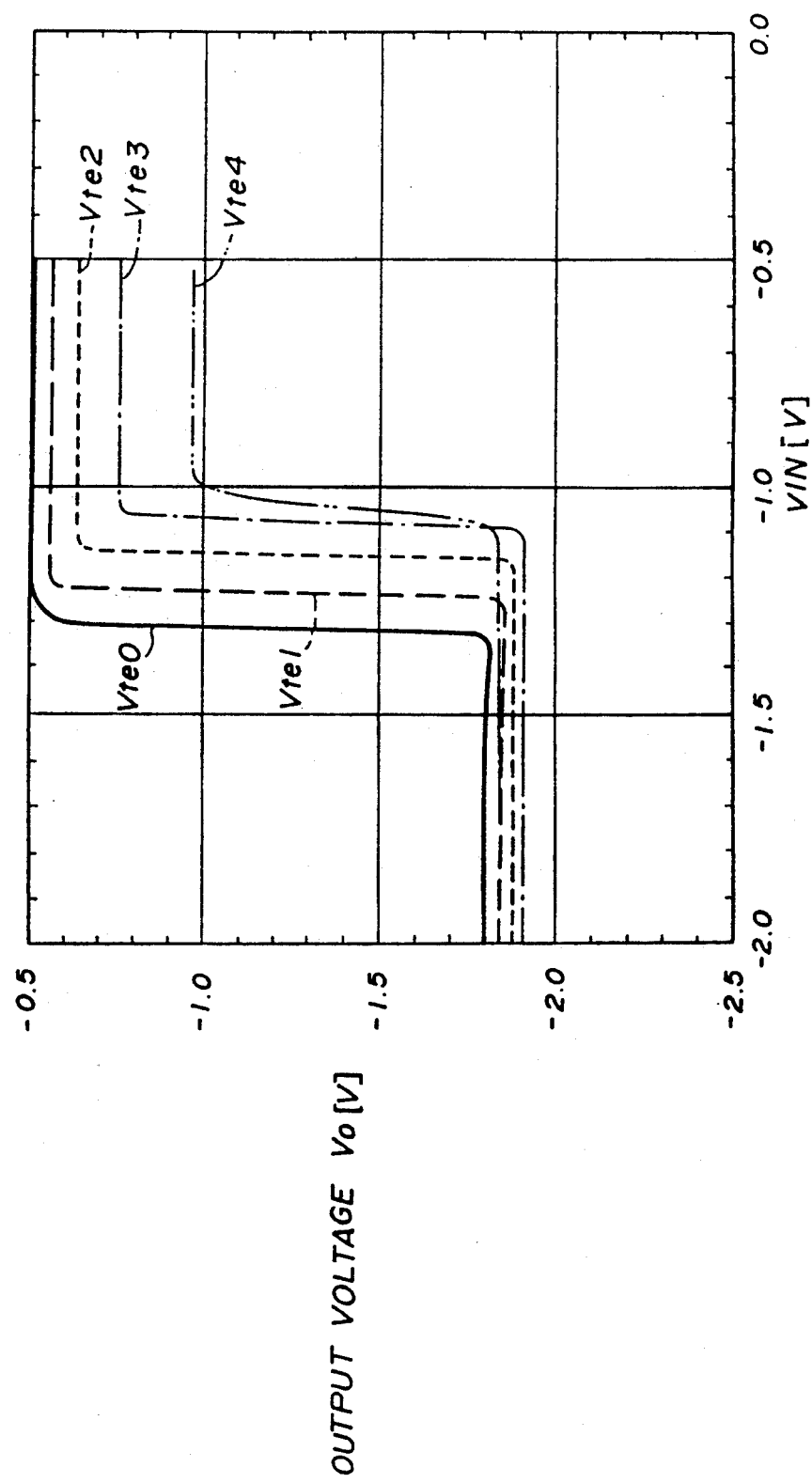

INTERFACE CIRCUIT PROVIDED BETWEEN A COMPOUND SEMICONDUCTOR LOGIC CIRCUIT AND A BIPOLAR TRANSISTOR CIRCUIT

BACKGROUND OF THE INVENTION

The present invention generally relates to semiconductor integrated circuits, and more particularly to an interface circuit provided between a compound semiconductor (GaAs, for example) logic circuit and a bipolar transistor circuit.

Recently, GaAs logic LSIs have widely been used in the field of signal processing circuits in data processing devices. GaAs logic LSIs consume a small amount of power and operate at high speeds. On the other hand, emitter coupled logic (ECL) circuits composed of bipolar transistors have also been used widely. Thus, there is a need to provide an interface circuit between the GaAs logic LSI and the ECL circuit. Such an interface circuit matches the output level of an output transistor in the GaAs logic LSI with the input level of an input transistor of the ECL circuit.

FIG. 1 illustrates a related interface circuit (GaAs/ECL interface circuit) provided between a GaAs logic circuit and an ECL circuit. The interface circuit shown in FIG. 1 is driven by two different power sources having voltages Vss1 (= −2.0 V) and Vss2 (= −1.5 V) with respect to a ground potential GND. As shown, the interface circuit has an input buffer circuit 1, a level shift circuit 2, a super buffer circuit 3, an output transistor T00, an output level adjustment circuit 4 and an output terminal resistor RL. The input buffer circuit 1 has transistors T21 and T22. The level shift circuit 2 has transistors T23 and T24, and a diode DR21. The super buffer circuit 3 has a high speed driving ability and comprises of transistors T25, T26, T27 and T28. The output level adjustment circuit 4 is made up of transistors T29 and T30.

The transistors T21, T24, T25, T29 and T30 are formed of depletion type (normally ON type) Schottky barrier (metal semiconductor) field effect transistors having GaAs compound semiconductors as major components. The transistors T22, T23, T26, T27, T28 and T00 are formed of enhancement type (normally OFF type) Schottky barrier field effect transistors.

The source of the transistor T00, that is the terminal connected to, the output terminal resistor RL connected to an output terminal OUT, has a function of matching the output level of the interface circuit shown in FIG. 1 with the input level of an ECL circuit 5. Normally, the output terminal resistor RL has a resistance equal to 50 ohms, and also functions to prevent the occurrence of the reflection of a signal wave from the ECL circuit 5. The output level adjustment circuit 4 serves as a current source, and increases the low level of the output terminal OUT by, for example, 100 mV.

The ECL circuit 5 has a differential circuit, comprising emitter-coupled npn bipolar transistors Q1 and Q2, and resistors R1 and R2 provided for the setting of the operation of the ECL circuit 5. The collectors of the bipolar transistors Q1 and Q2 are respectively coupled, though the resistors R1 and R2, to a high-voltage power supply line having a high power supply voltage $V_{CC}$. The emitters of the bipolar transistors Q1 and Q2 are connected to receive a low power supply volta $V_{EE}$. The collector of the bipolar transistor Q2 forms an output terminal OUT' of the ECL circuit 5. A reference voltage Vref is applied to the base of the bipolar transistor Q2.

When an input logic signal having a high (H) level is applied to the gate of the transistor T22 of the input buffer circuit 1, an output logic signal having a high (H) level is output to the output terminal OUT. Then, the output logic signal is applied to the base B of the transistor Q1 of the ECL circuit 5. On the other hand, when the input logic signal has a low (L) level, the output logic signal obtained at the output terminal OUT has a low (L) level, which corresponds to a voltage increased by 100 mV from the voltage Vss1 due to the function of the output level adjustment circuit 4.

Another related circuit is shown in FIG. 2, in which those parts which are the same as those shown in FIG. 1 are given the same reference numerals. A normal buffer circuit 6 is substituted for the super buffer circuit 3 shown in FIG. 1. The normal buffer circuit 6 has a depletion type Schottky barrier field effect transistor T31, and an enhancement type Schottky barrier field effect transistor T32. The output signal of the normal buffer circuit 6 rises more slowly than that of the super buffer circuit 3. That is, the super buffer circuit 3 rises its output signal rapidly, so that it can be applied to a specific application, such as a clock signal. The circuit shown in FIG. 2 operates in the same way as that shown in FIG. 1.

However, the circuits shown in FIGS. 1 and 2 have disadvantages, which will be described with reference to FIGS. 3A and 3B. FIG. 3A is a graph showing the relationship between an output current (Iout [A]) passing through the output terminal resistor RL and an output voltage (VO [V]) obtained at the output terminal OUT. In FIG. 3A, a line A is a load resistance curve of the output terminal resistor RL (equal to 50 ohms), and a curve B is a load resistance curve of the transistor T29. It will be noted that the transistor T29 functions as a constant-current source and thus its impedance is approximately a few kiloohms (e.g., 8 kiloohms). Vte0 (=0 V), Vte1 (=0.1 V), Vte2 (=0.2 V), Vte3 (=0.3 V) and Vte4 (=0.4 V) are threshold voltages of samples of the output transistor T00. That is, the threshold voltages of the samples are different from each other by 100 mV. The output transistor T00 operates at a cross point of the lines A and B. It can be seen from the graph of FIG. 3A that when the output terminal OUT is maintained at the low level, the output impedance of the interface circuit shown in FIG. 1 or FIG. 2 is extremely high, as compared with that of the resistance of the output terminal resistor RL. If the interface circuit shown in FIG. 1 or FIG. 2 processes a high-speed signal having a frequency equal to or higher than 100 MHz, signal wave reflection will take place and thus the output signal waveform will deteriorate.

Further, as shown in FIG. 3B, the output voltages are much different from each other, due to the respective, different threshold voltages of the various different output transistors T00 which may be used. Such variations in the output voltage will cause a malfunction of the ECL circuit 5.

The inventor made an improvement in the circuits shown in FIGS. 1 and 2 in order to reduce the above-mentioned disadvantages. FIG. 4 shows an improvement in the circuit shown in FIG. 1 made by the inventor. A super buffer circuit 3A in FIG. 4 is substituted for the super buffer circuit 3 shown in FIG. 1. An enhancement type Schottky barrier field effect transistor 33 is added to the circuit of the super buffer circuit 3 shown in FIG. 1. The gate and drain of the transistor 33 are mutually connected, and the source thereof is connected to the drain of the transistor T28. The transistor 33 functions to increase the gate voltage of the output transistor T00 by the value of the threshold voltage of the transistor 33, providing a reduced output impedance of the interface circuit shown in FIG. 4 relatively to that FIGS. 1 and 2. The improvement shown in FIG. 4 does not use the output level adjustment circuit 4 shown in FIG. 1. A level conversion circuit employing a transistor similar to the transistor T33 is disclosed in Japanese Laid-Open Patent Publication No. 1-137827.

FIG. 5A illustrates the output impedance characteristic of the improved circuit shown in FIG. 4. A line B1 in FIG. 5A shows the output impedance (differential output resistance) of the improved interface circuit shown in FIG. 4 when the output terminal is maintained at the low level. It can be seen from FIG. 4 that the line A crosses the curves of the threshold voltages $Vte0$—$Vte4$ at substantially flat portions thereof and the output impedance is approximately 22 ohms for $Vte2 = 0.2$ V, which is approximately 1/40 of the output impedance of the circuit shown in FIG. 1.

FIG. 5B illustrates the output level characteristic of the improved interface circuit shown in FIG. 4. It can be seen from FIG. 5B that variations in the output signal, resulting from differences of the respective threshold voltages of the differing output transistors T00, can be reduced.

However, it is still desired to further suppress the variations in the output signal obtained at the output terminal OUT due to the different threshold voltages.

SUMMARY OF THE INVENTION

It is an object of the present invention to provide a further improved interface circuit having further reduced variations in the output signal due to the different threshold voltages of the output transistor.

The above-mentioned object of the present invention is achieved by an interface circuit provided between a compound semiconductor logic circuit and a bipolar transistor circuit, which comprises an input buffer part for receiving an input signal from the GaAs logic circuit and for outputting a buffered input signal, and an output driver circuit for generating a drive signal from the buffered input signal. The interface circuit also includes an output transistor having a gate connectable to receive the drive signal, a first terminal connectable to receive a first power supply voltage, and a second terminal, and an output terminal connected to the second terminal of the output transistor and the bipolar transistor circuit. Further, the interface circuit includes an output level adjustment circuit which has a first Schottky barrier transistor having a gate, a first terminal connected to the gate of the Schottky barrier transistor and the gate of the output transistor and a second terminal, and which generates a constant voltage which is applied to the second terminal of the Schottky barrier transistor.

DESCRIPTION OF THE DRAWINGS

FIG. 5A is a graph illustrating the output impedance characteristic of the circuit shown in FIG. 4;

FIG. 7A is a graph illustrating the output impedance characteristic of the interface circuit shown in FIG. 6;

FIG. 7B is a graph illustrating the output level characteristic of the interface circuit shown in FIG. 6;

DESCRIPTION OF THE PREFERRED EMBODIMENTS

Figure 6:
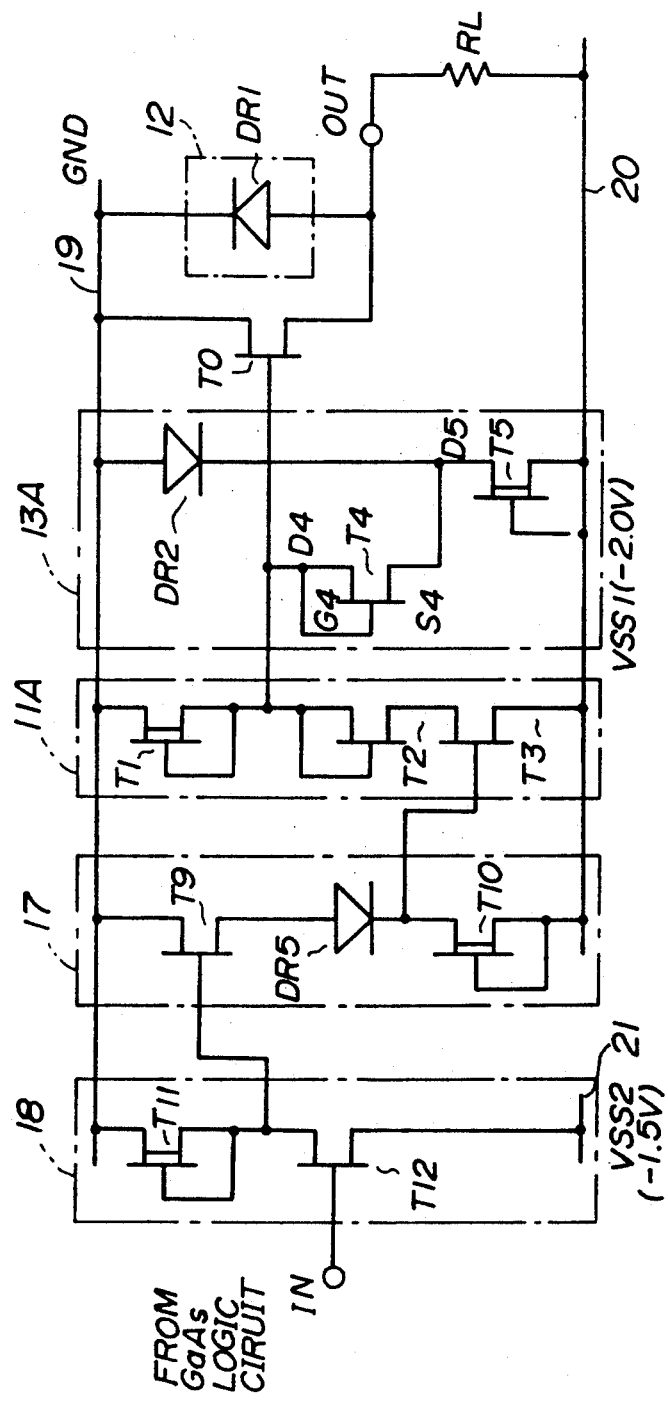
FIG. 6 is a circuit diagram of an interface circuit according to a first preferred embodiment of the present invention.

FIG. 6 is a circuit diagram of an interface circuit provided between a GaAs logic circuit and an ECL circuit according to a first preferred embodiment of the present invention. The interface circuit shown in FIG. 6 is made up of an input buffer circuit 18, a level shift circuit 17, an output driver circuit 11A, an output level adjustment circuit 13A, an output transistor T0 comprising an enhancement type Schottky barrier field effect transistor and an operation protecting circuit 12.

The output transistor T0 has a drain connected to a first power supply line 19 set to the ground potential GND, and a source connected to an output terminal OUT. A output terminal resistor RL equal to, for example, 50 ohms, is connected between the output terminal OUT and a second power supply line 20 set to a voltage Vss1 equal to, for example, $-2.0$ V.

Figure 1:
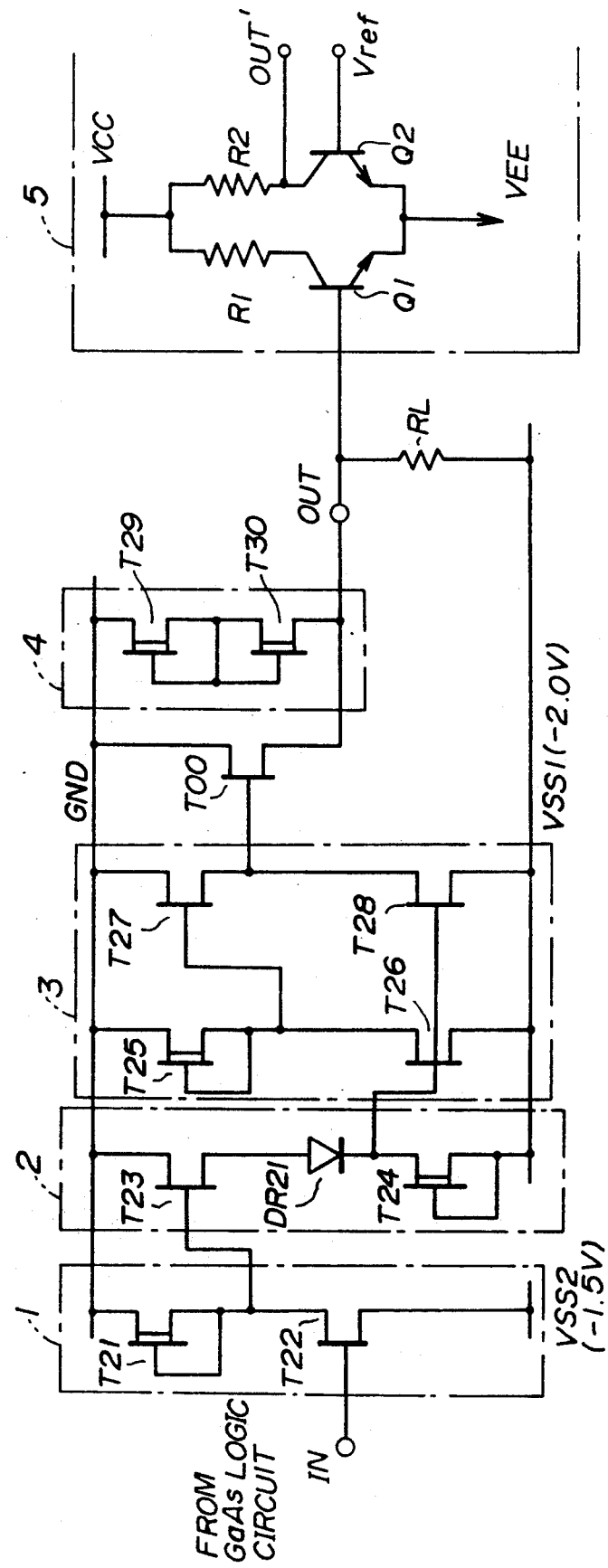
FIG. 1 is a circuit diagram of a related interface circuit provided between a GaAs logic circuit and an emitter coupled logic circuit.
Figure 2:
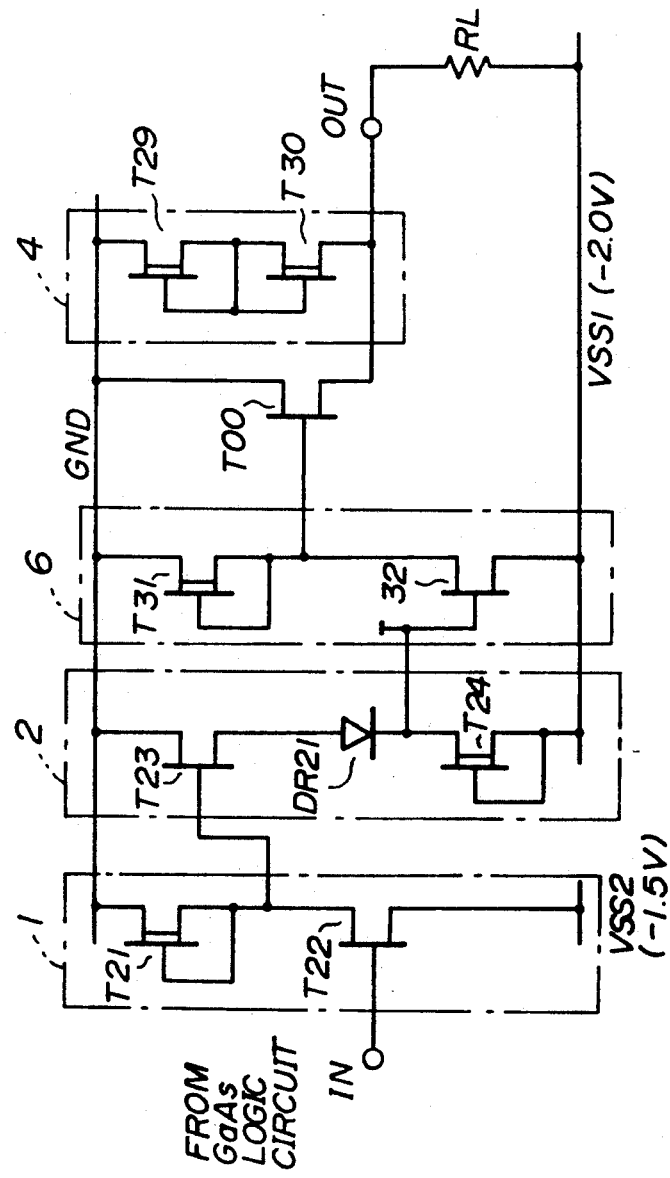
FIG. 2 is a circuit diagram of another related interface circuit.
Figure 3A:
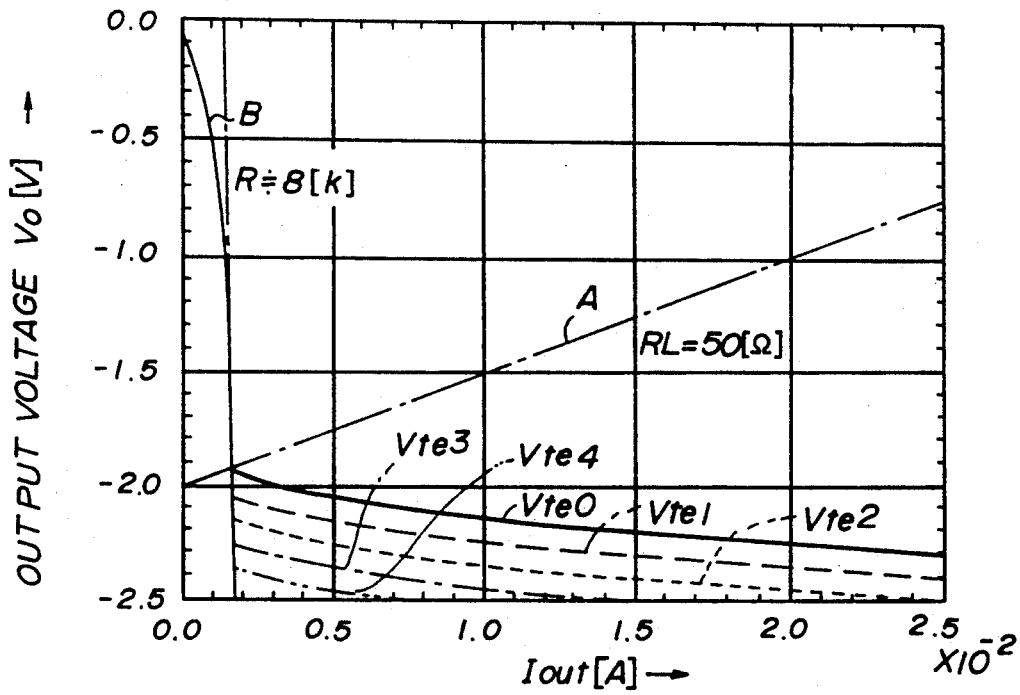
FIG. 3A is a graph illustrating the output impedance characteristic of the circuit shown in FIG. 1.
Figure 3B:
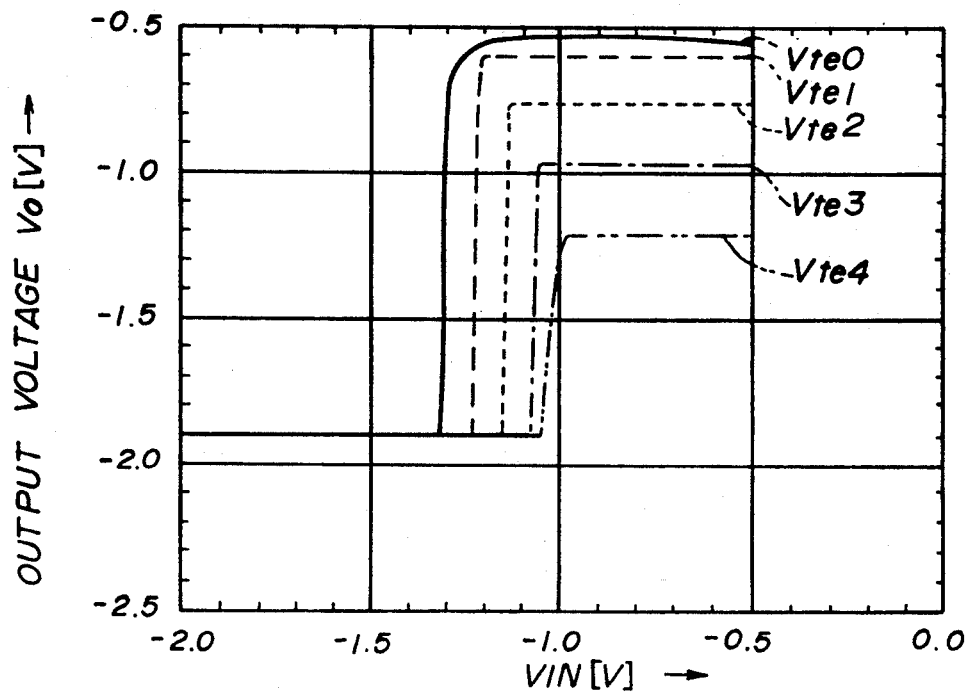
FIG. 3B is a graph illustrating the output level characteristic of the circuit shown in FIG. 1.
Figure 4:
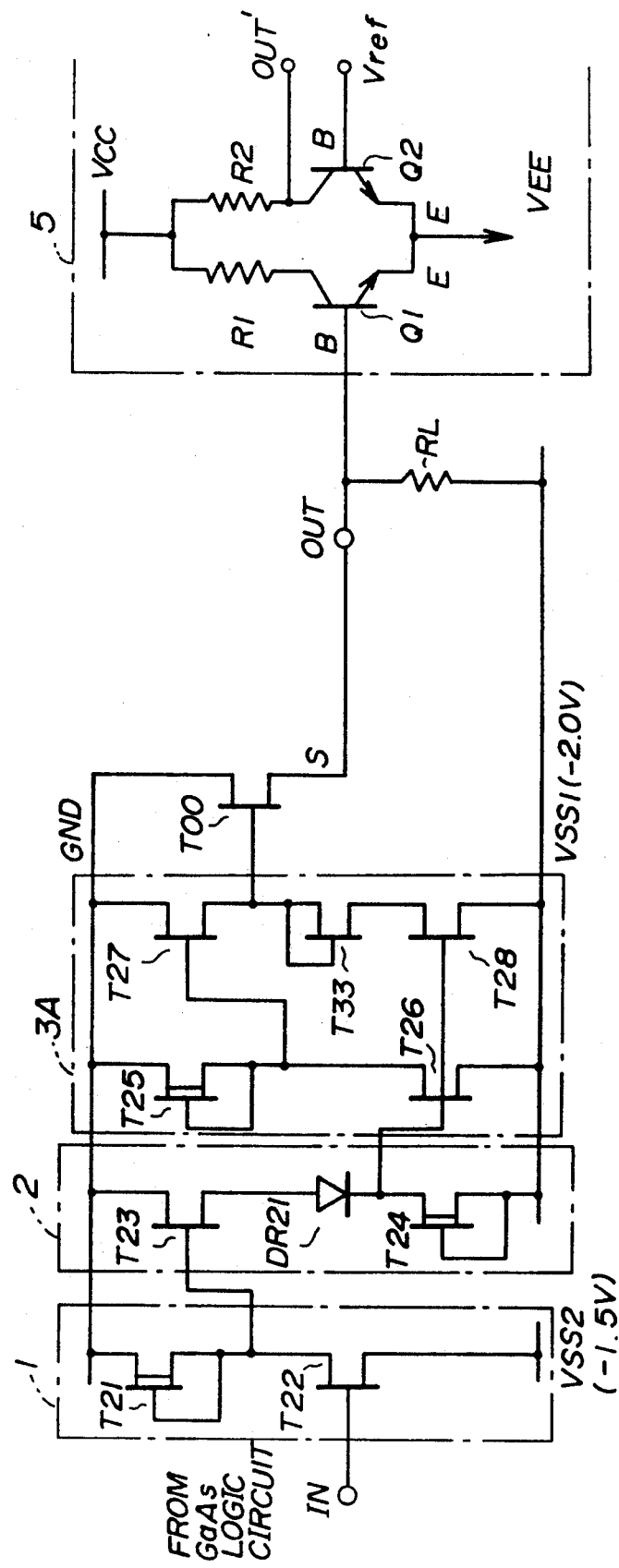
FIG. 4 is a circuit diagram of an improvement in the circuit shown in FIG. 2 made by the inventor.

The output driver circuit 11A is composed of three transistors T1, T2 and T3. The transistor T1 is formed of a depletion type Schottky barrier field effect transistor, and has a drain connected to the first power supply line 19, a source and a gate connected to the source. The source and gate of the transistor T1 are connected to the gate of the output transistor T0. The transistor T2 is formed of an enhancement type Schottky barrier field effect transistor. The drain and gate of the transistor T2 are connected to the gate and source of the transistor T1 and the gate of the output transistor T0. The transistor T2 corresponds to the aforementioned transistor T33 shown in FIG. 4, and functions to reduce the output impedance of the interface circuit obtained when it outputs the low-level output signal. The transistor T3 comprises an enhancement type Schottky barrier field effect transistor. The drain of the transistor T3 is connected to the source of the transistor T2, and the source of the transistor T3 is connected to the second power supply line 20.

The input buffer circuit 18 is composed of transistors T11 and T12. The transistor T11 is formed of a depletion type Schottky barrier field effect transistor, and the transistor T12 is formed of an enhancement type Schottky barrier field effect transistor. The drain of the transistor T11 is connected to the first power supply line 19, and the source thereof is connected to the drain of the transistor T12. The gate and source of the transistor T11 are mutually connected. The gate of the transistor T12 is connected to an input terminal IN of the interface circuit, and the source thereof is connected to a third power supply line 21 set to a voltage Vss2 equal to, for example, $-1.5$ V.

The level shift circuit 17 is composed of a transistor T9, a level shift diode DR5, and a transistor T10. The transistor T9 is formed of an enhancement type Schottky barrier field effect transistor. The drain of the transistor T9 is connected to the first power supply line 19, and the source thereof is connected to the anode of the level shift diode DR5. The gate of the transistor T9 is connected to the source and gate of the transistor T11 and the drain of the transistor T12. The cathode of the level shift diode DR5 is connected to the drain of the transistor T10 and the gate of the transistor T3 of the output driver circuit 11A. The gate and source of the transistor T10 are connected to the second power supply line 20. The transistor T10 is formed of a depletion type Schottky barrier field effect transistor.

The operation protecting circuit 12 is formed of a diode DR1 having an anode connected to the output terminal OUT and the source of the output transistor T0, and a cathode connected to the first power supply line 19. The diode DR1 forms a discharge path. A reverse current or a change resulting from static electricity current is allowed to pass through the diode DR1 when the output terminal OUT changes from the high level to the low level or vice versa, so that the output transistor T0 can be protected from such a reverse current or charge.

The output level adjustment circuit 13A is composed of an enhancement type Schottky barrier field effect transistor T4, a depletion type Schottky barrier field effect transistor T5, and a level shift diode DR2. The anode of the level shift diode DR2 is connected to the first power supply line 19, and the cathode thereof is connected to the source of the transistor T4 and the drain of the transistor T5. The drain and gate of the transistor T4 are connected to the gate of the output transistor T0, and the source of the transistor T4 is connected to the drain of the transistor T5. The gate and source of the transistor T5 are connected to the second power supply line 20.

The level shift diode DR2 determines the level of a node D5 at which the drain of the transistor T5 is connected to the source of the transistor T4. The transistor T5 functions as a constant-voltage source, and maintains the node D5 at a fixed voltage which is determined by the level shift diode DR2. The transistor T4 can be produced under the same production condition as the output transistor T0. Thus, the threshold voltage of the transistor T4 is substantially equal to that of the output transistor T0. In other words, the transistors T0 and T4 have substantially identical threshold voltage deviations from a designed threshold voltage.

The potential of a node D4 which corresponds to the drain of the transistor T4 is higher than the potential of the node D5 by the threshold voltage of the transistor T4. The potential of the output terminal OUT is lower than the potential of the node D4 by the threshold voltage of the output transistor T0. As indicated above, the threshold voltage of the output transistor T0 is almost the same as that of the transistor T4, so that the potential of the output terminal OUT is fixed to the potential of the node D5. With the above arrangement, it becomes possible to fix the output terminal OUT to the constant voltage (which corresponds to the potential of the node D5) irrespective of variations of the threshold voltage of the output transistor T0.

Figure 5B:
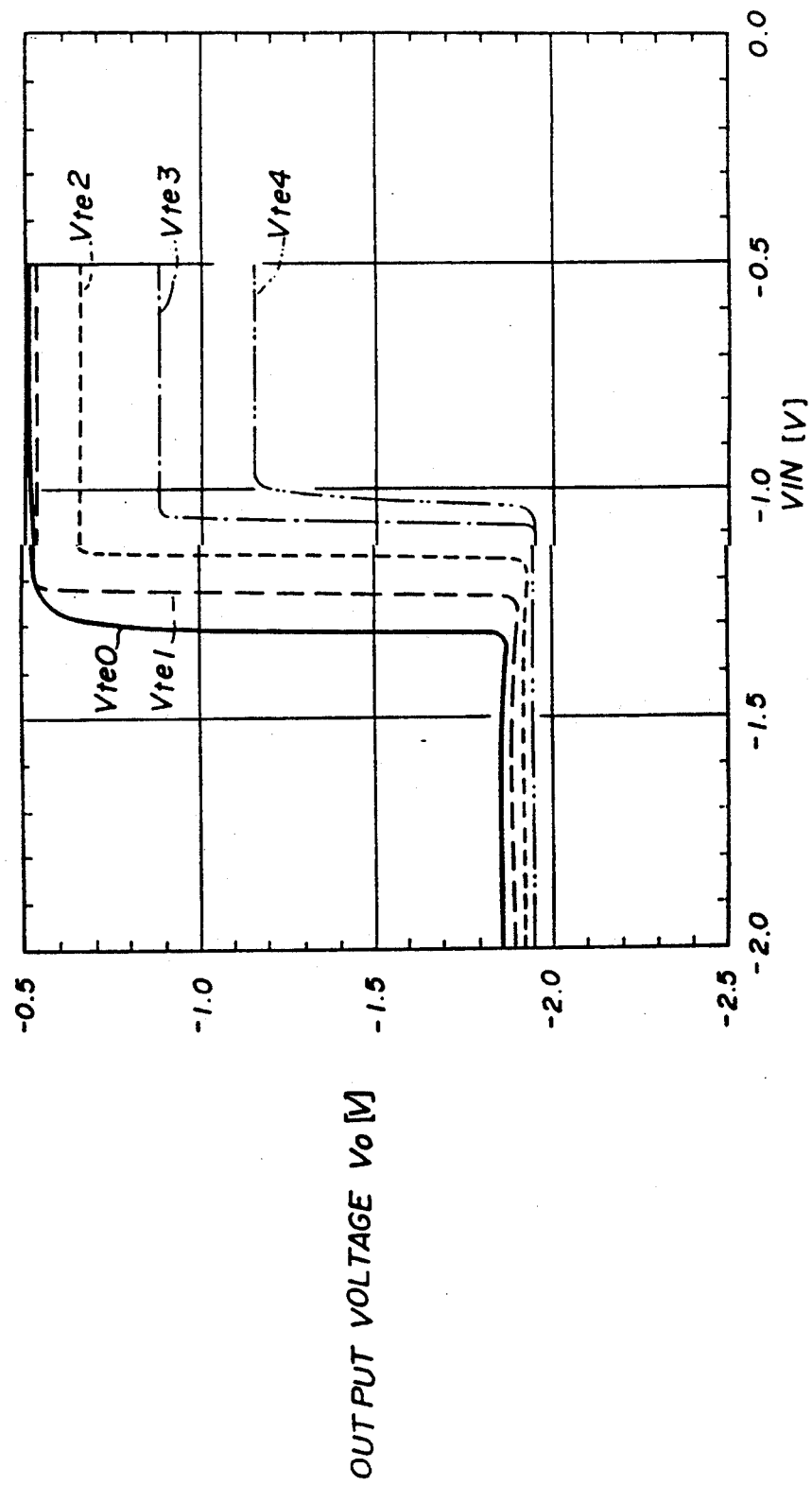
FIG. 5B is a graph illustrating the output level characteristic of the circuit shown in FIG. 4.

FIG. 7A illustrates the output impedance characteristic of the circuit shown in FIG. 6, and FIG. 7B illustrates the output level characteristic of the circuit shown in FIG. 6. It can be seen from FIG. 7B that variations in the output voltage due to the different threshold voltages of the output transistor T0 can be further reduced, as compared with those shown in FIG. 5B. Further, since the transistor T1 is of the depletion type, it has a threshold voltage smaller than that of the enhancement type transistor. Thus, the high level of the output signal can be increased.

During the operation of the circuit shown in FIG. 6, when an input logic signal having a high level is applied to the gate of the transistor T12 via the input terminal IN, the transistor T9 of the level shift circuit 17 is turned OFF, and the transistor T3 of the output driver circuit 11A is also turned OFF. Thus, a voltage approximately equal to the ground potential is applied to the gate of the output transistor T0 via the transistor T1, so that the potential of the output terminal OUT is set to the high level. During the above operation, a variation in the threshold voltage of the output transistor T0 is canceled by a variation in the threshold voltage of the transistor T4. Thus, the output signal at the output terminal OUT is not affected by the existence of a variation in the threshold voltage of the output transistor T0.

On the other hand, when the input logic signal has a low level, the transistor T12 of the input buffer circuit 18 is turned ON, and the transistor T9 of the level shift circuit 17 is also turned ON. Thus, the gate of the transistor T3 of the output driver circuit 11A is provided with a voltage lower than the ground potential by the sum of the threshold voltage of the transistor T9 and a forward voltage drop developed across the level shift diode DR5. Thus, the transistor T3 is turned ON. At this time, the gate voltage of the output transistor T0 is higher than the potential of the node D5 by the threshold voltage of the transistor T4, and thus the output transistor T0 is turned OFF. As has been described previously, the output terminal OUT is fixed at the potential of the node D5 due to the function of the transistors T4 and T5 of the output level adjustment circuit 13A. Thus, the interface circuit outputs a low level voltage signals, equal to the potential of the node D5, to the output terminal OUT.

Figure 8:
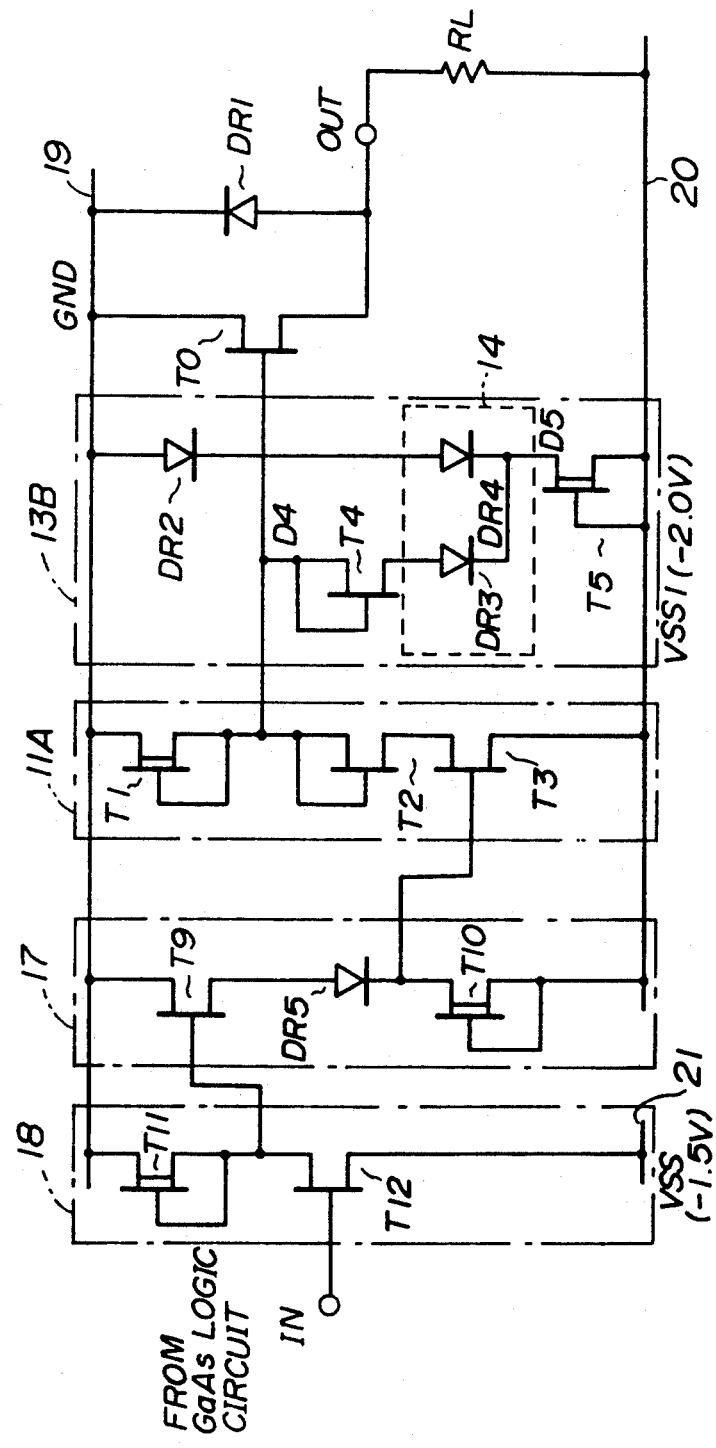
FIG. 8 is a circuit diagram of an interface circuit according to a second preferred embodiment of the present invention.

A description will now be given of an interface circuit according to a second preferred embodiment of the present invention with reference to FIG. 8, in which those parts which are the same as those shown in FIG. 6 are given the same reference numerals.

A second operation protecting circuit 14 is provided in the output level adjustment circuit 13A shown in FIG. 6. Now, the output level adjustment circuit having the second operation protecting circuit 14 is identified by reference numeral 13B in FIG. 8. The second operation protecting circuit 14 is composed of diodes DR3 and DR4. The anode of the diode DR3 is connected to the source of the transistor T4, and the cathode thereof is connected to the drain of the transistor T5. The anode of the diode DR4 is connected to the cathode of the level shift diode DR2, and the cathode of the diode DR4 is connected to the drain of the transistor T5.

The second operation protecting circuit 14 prevents a current from passing through the transistors T4 and T1 in the reverse direction when the second power supply line 20 has a potential higher than the ground potential GND of the first power supply line 19. Normally, the second power supply line 20 is set at a potential lower than the ground potential GND. However, for example, when the interface circuit shown in FIG. 8 is tested, the potential of the second power supply line 20 may become higher than the ground potential GND. In this case, the transistor T4 may be damaged. The diodes DR3 and DR4 prevent the above-mentioned current passing through the transistor T4. It will be noted that the diode DR4 also functions as a level shift diode, which determines the potential of the node D5 together with the level shift diode DR2.

Figure 9:
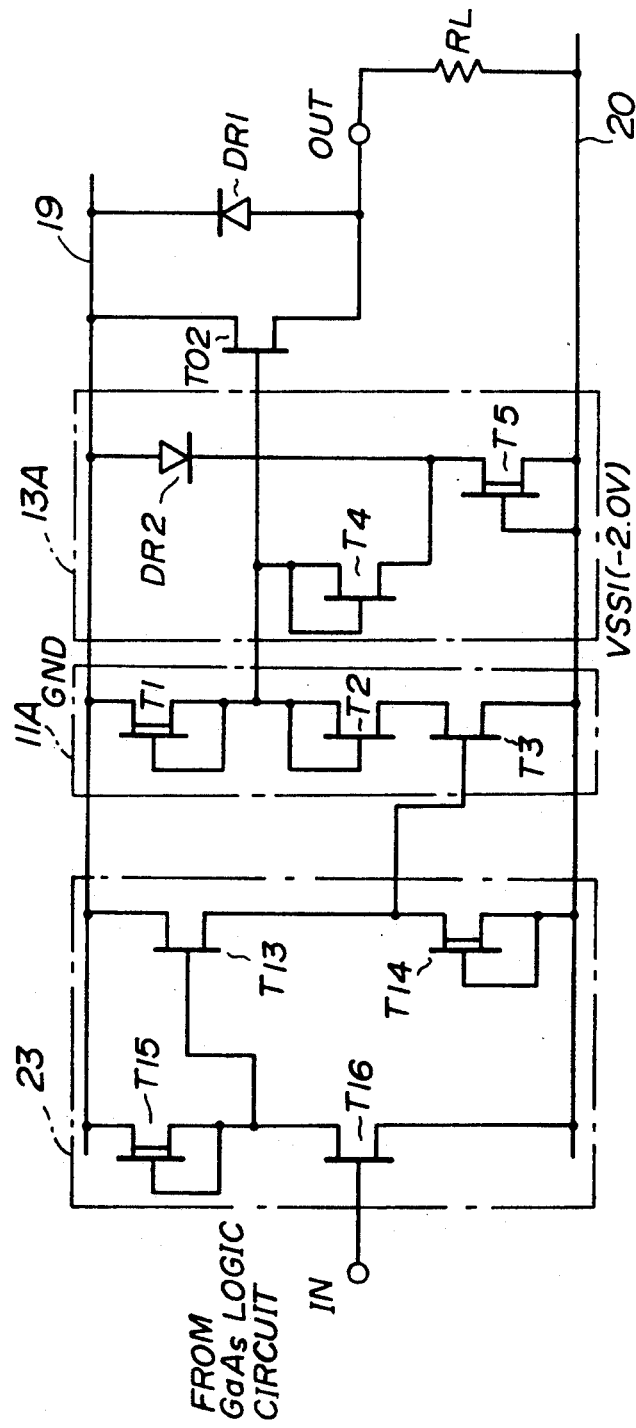
FIG. 9 is a circuit diagram of an interface circuit according to a third preferred embodiment of the present invention.

FIG. 9 illustrates an interface circuit according to a third preferred embodiment of the present invention. In FIG. 9, those parts which are the same as those shown in FIG. 6 are given the same reference numerals. The interface circuit shown in FIG. 9 is driven by a single power source which provides the voltage Vss1 equal to −2.0 V, while the interface circuit shown in FIG. 6 is driven by the two power sources Vss1 and Vss2. An input buffer circuit 23 is substituted for the input buffer 18 and the level shift circuit 17 shown in FIG. 6. The input buffer circuit 23 is composed of two depletion type Schottky transistors T15 and T14, and two enhancement type Schottky transistors T13 and T16. The input buffer circuit 23 corresponds to a circuit obtained by omitting the diode DR5 of the level shift circuit 17 shown in FIG. 6. That is, the source of the transistor T13 is directly connected to the drain of the transistor T14 and the gate of the transistor T13.

Figure 10:
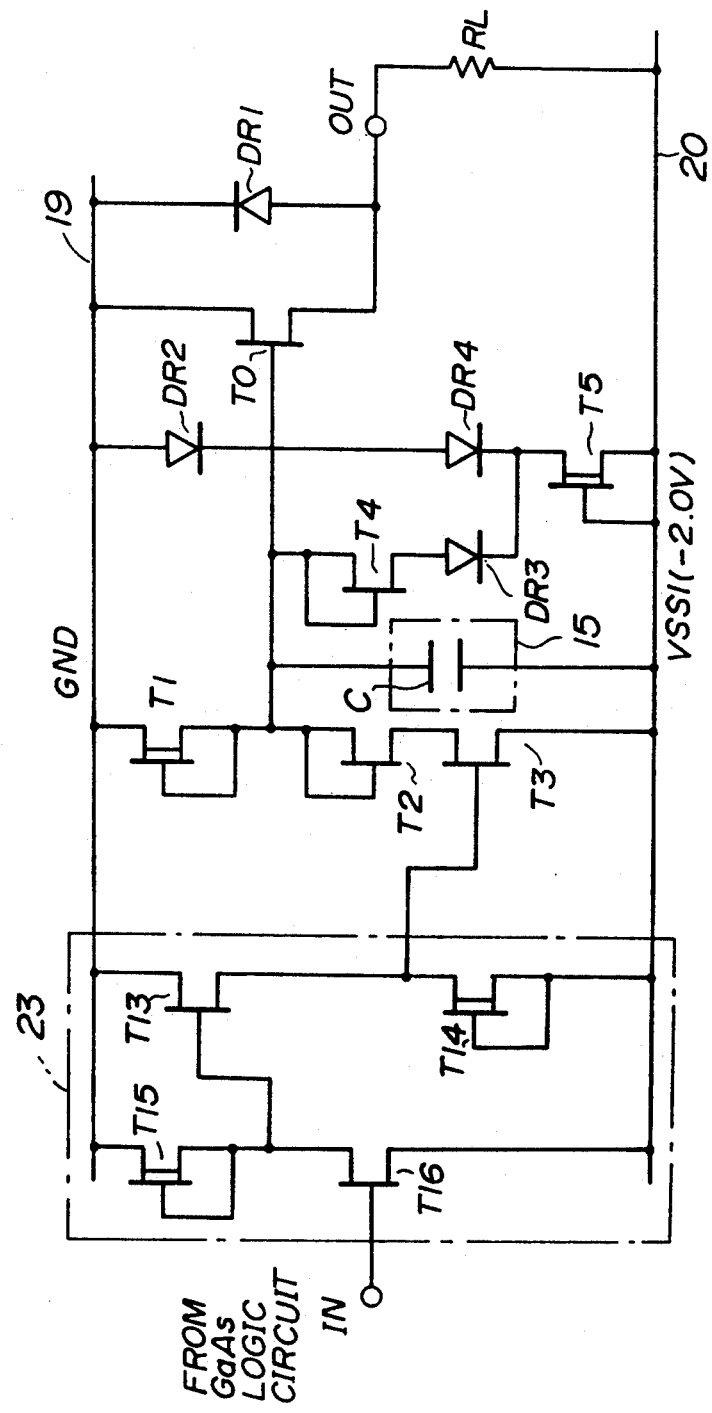
FIG. 10 is a circuit diagram of an interface circuit according to a fourth preferred embodiment of the present invention.

FIG. 10 illustrates an interface circuit according to a fourth preferred embodiment of the present invention. In FIG. 10, those parts which are the same as those shown in the previous figures are given the same reference numerals. The interface circuit shown in FIG. 10 is obtained by adding the diodes DR3 and DR4 shown in FIG. 8 and an operation delay circuit 15 to the interface circuit shown in FIG. 9. The operation delay circuit 15 functions to elongate the time it takes for the signal applied to the gate of the output transistor T0 to rise, so that the output signal obtained at the output terminal OUT rises slowly, as compared with the previous interface circuits.

It will be noted that the output signal obtained at the output terminal OUT in each of the previous embodiments changes more rapidly than signals processed in the ECL circuit. This may cause a malfunction of the ECL circuit. The operation delay circuit 15 is formed of a capacitor C connected between the gate of the output transistor T0 and the second power supply line 20, so that an increased gate capacitance of the output transistor T0 is coupled to the gate thereof. The existence of the capacitor C delays a change of the state of the output transistor T0, so that the changing speed of the output signal of the interface circuit can match with that of the signal processed in the ECL circuit. As a result, it becomes possible to prevent the occurrence of ringings (transient vibrations of the output signal).

Figure 11:
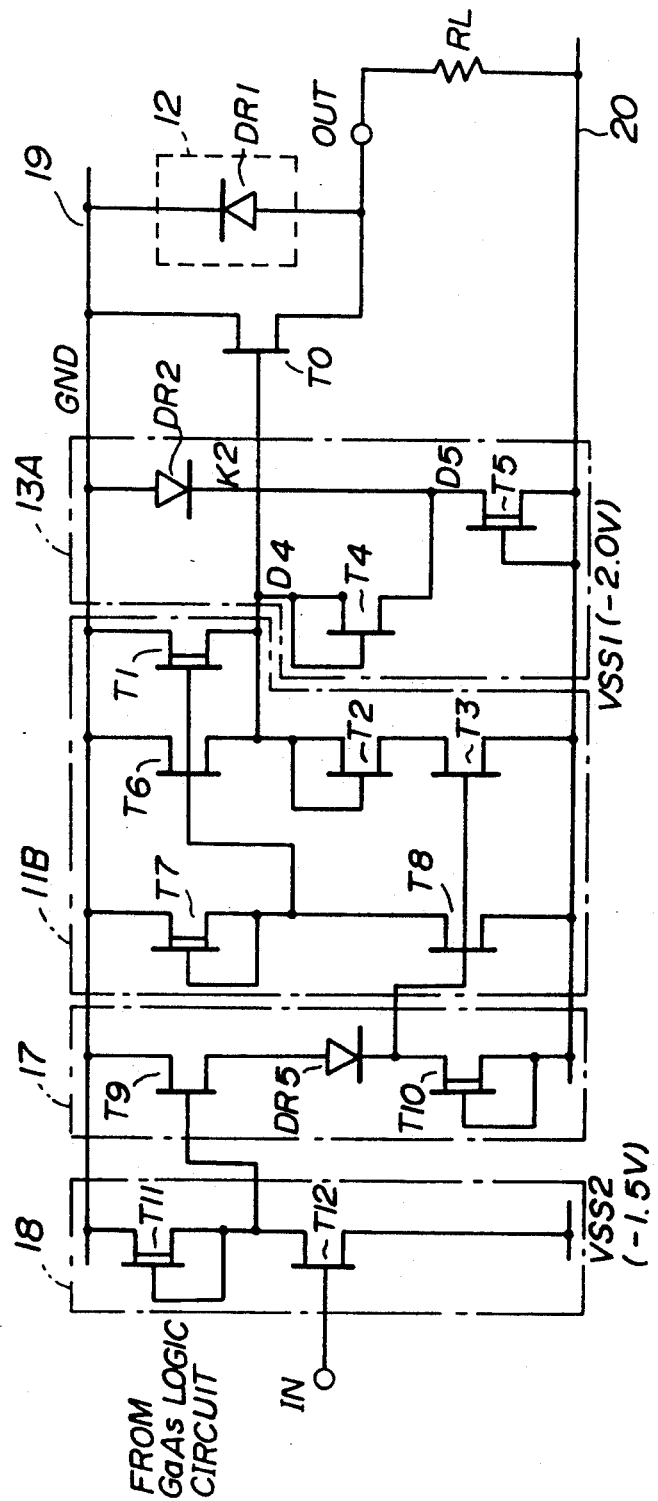
FIG. 11 is a circuit diagram of an interface circuit according to a fifth preferred embodiment of the present invention.

A description will now be given of an interface circuit according to a fifth preferred embodiment of the present invention with reference to FIG. 11, in which those parts which are the same as those shown in the previous figures are given the same reference numerals. A super buffer circuit 11B is substituted for the buffer circuit 11A shown in FIG. 6. The super buffer circuit 11B is the same as the super buffer circuit 3A shown in FIG. 4.

The super buffer circuit 11B has a depletion type Schottky barrier field effect transistor T7, two enhancement type Schottky barrier field effect transistors T6 and T8 in addition to the transistors T1, T2 and T3. The drain of the transistor T7 is connected to the first power supply line 19, and the source and drain thereof are connected to each other. Further, the source and gate of the transistor T7 are connected to the gates of the transistors T6 and T1 and the drain of the transistor T8. The gate of the transistor T8 is connected to the cathode of the diode DR5, and the source thereof is connected to the source of the transistor T8. The gate of the transistor T8 is also connected to the gate of the transistor T3. The transistors T6, T7 and T8 facilitate the turn-ON operation of the transistor T1 so that an increased bias current can pass through the output transistor T0. That is, when the transistor T1 is turned ON in response to the high level of the input signal applied to the input terminal IN, the transistor T6 is simultaneously turned ON. Thus, a current passing through the transistor T1 and a current passing through the transistor T6 are applied to the gate of the output transistor T0.

Figure 12:
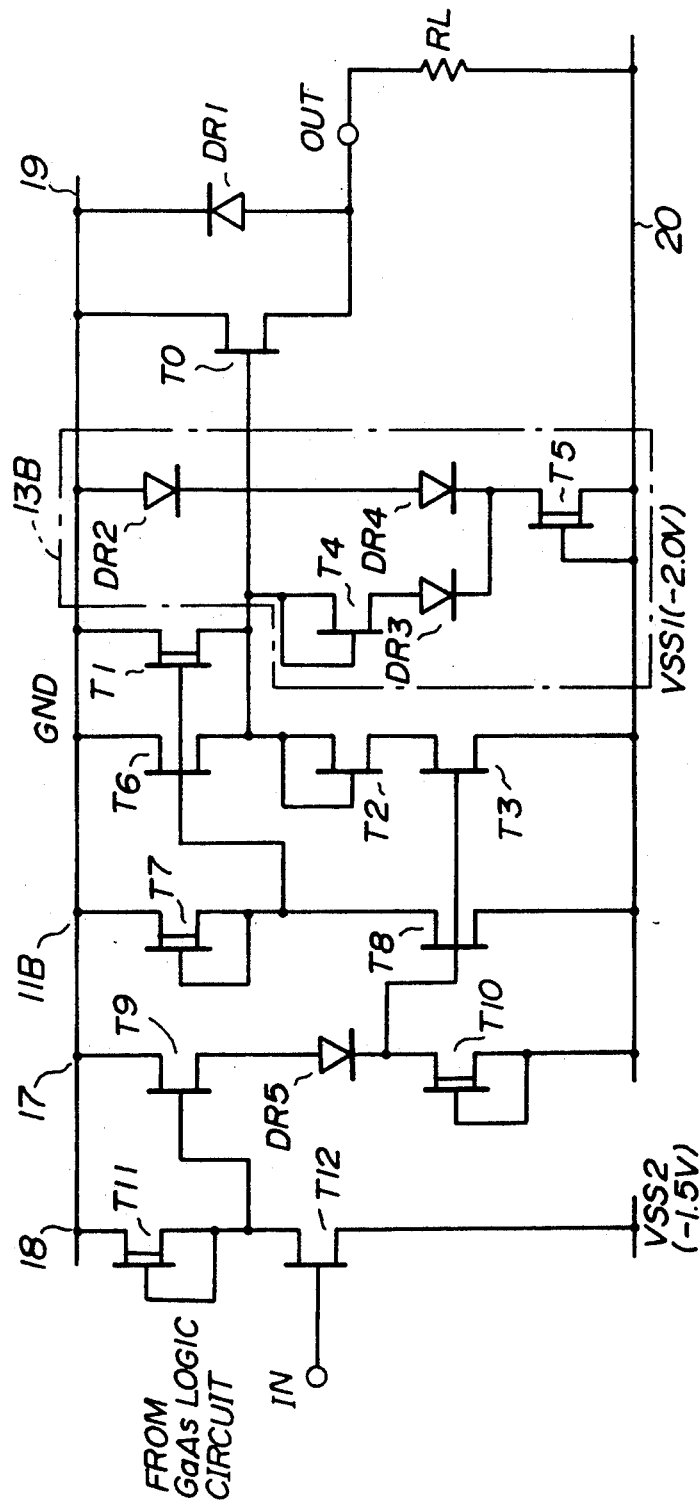
FIG. 12 is a circuit diagram of an interface circuit according to a sixth preferred embodiment of the present invention.

FIG. 12 illustrates an interface circuit according to a sixth preferred embodiment of the present invention. In FIG. 12, those parts which are the same as those shown in the previous figures are given the same reference numerals. The interface circuit shown in FIG. 12 is obtained by adding the aforementioned diodes DR3 and DR4 to the output level adjustment circuit 13A shown in FIG. 11. That is, the output level adjustment circuit 13B shown in FIG. 12 is the same as that shown in FIG. 8. The diodes DR3 and DR4 shown in FIG. 12 function in the same way as those shown in FIG. 8.

Figure 13:
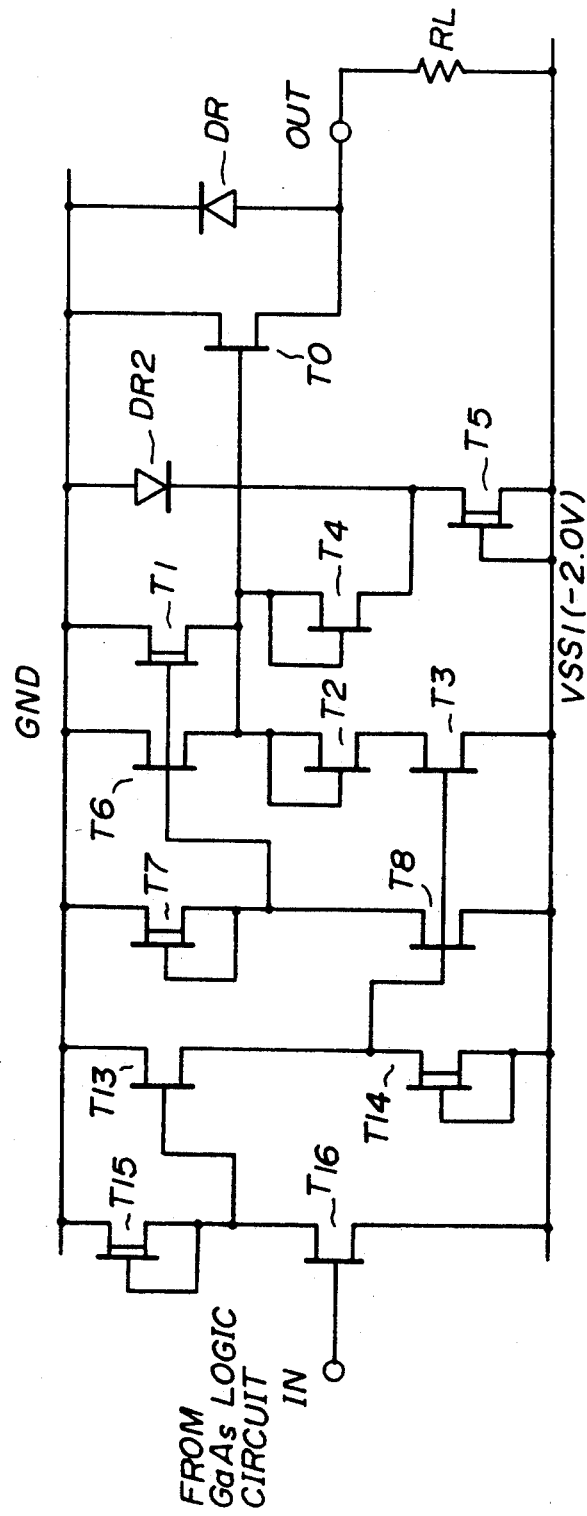
FIG. 13 is a circuit diagram of an interface circuit according to a seventh preferred embodiment of the present invention.

FIG. 13 illustrates an interface circuit according to a seventh preferred embodiment of the present invention. In FIG. 13, those parts which are the same as those shown in the previous figures are given the same reference numerals. The interface circuit shown in FIG. 13 is the same as that shown in FIG. 11 except that the interface circuit in FIG. 13 is driven by the single power source Vss1. For this purpose, the input buffer circuit 18 and the level shift circuit 17 shown in FIG. 11 are replaced by the input buffer circuit 19 composed of the transistors T13–T16.

Figure 14:
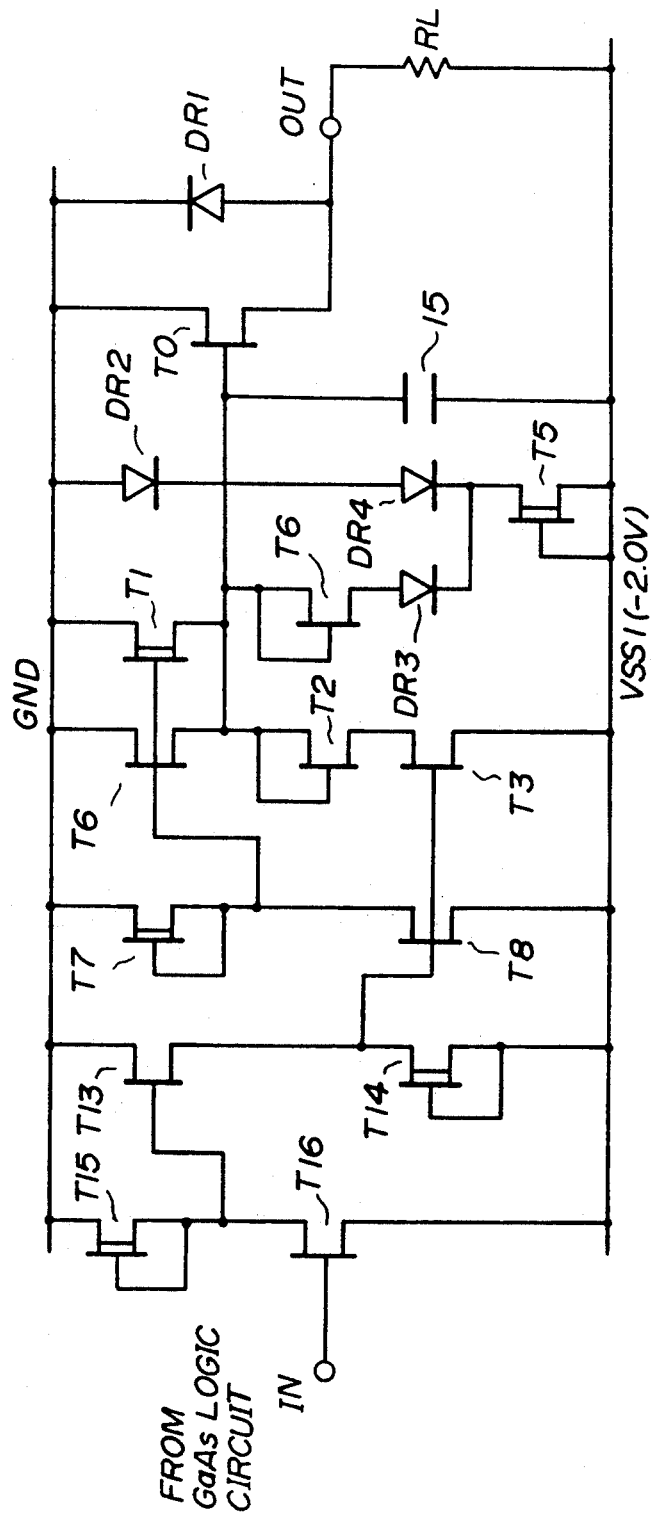
FIG. 14 is a circuit diagram of an interface circuit according to an eighth preferred embodiment of the present invention.

FIG. 14 illustrates an interface circuit according to an eighth preferred embodiment of the present invention. In FIG. 13, those parts which are the same as those shown in the previous figures are given the same reference numerals. The interface circuit shown in FIG. 14 is the same as that shown in FIG. 12 except that the interface circuit in FIG. 14 is driven by the single power source Vss1. For this purpose, the input buffer circuit 18 and the level shift circuit 17 shown in FIG. 12 are replaced by the input buffer circuit 19 composed of the transistors T13–T16.

Figure 15:
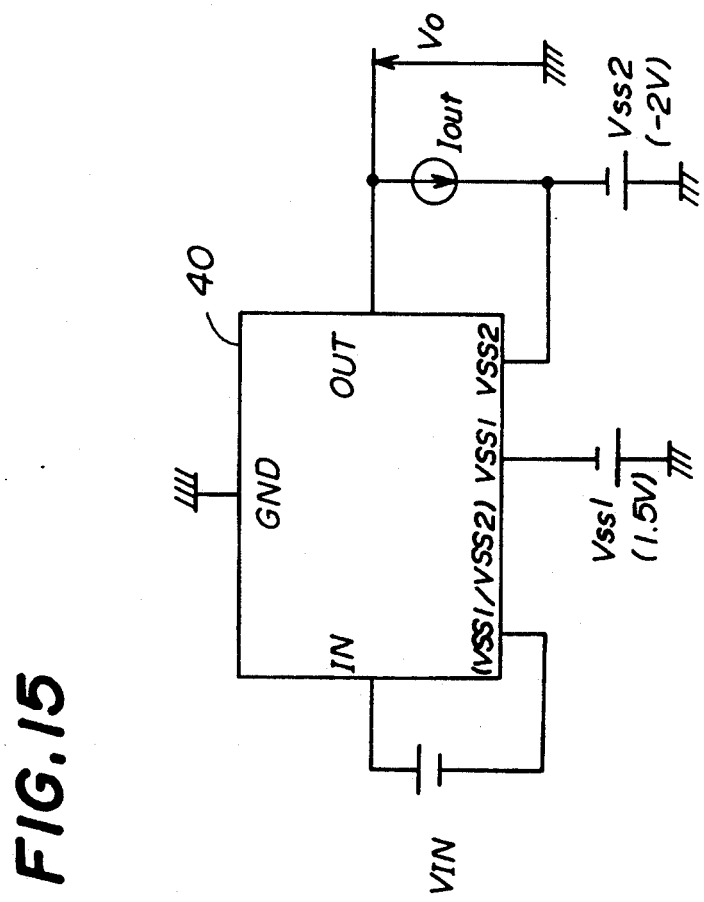
FIG. 15 is a circuit diagram of a circuit used in the experiments.

FIG. 15 illustrates a circuit used for obtaining the aforementioned characteristics in experiments. A reference numeral 40 indicates a chip of an interface circuit according to the aforementioned embodiments. A D.C. power supply source VIN is connected to the input terminal IN and a power supply terminal (Vss1/Vss2) to which the power supply voltage Vss1 or Vss2 is applied. A power supply voltage (Vss1) of the chip 40 is connected to a low-potential terminal of a −1.5 V D.C. power supply source, which has a high-potential terminal that is grounded. A power supply terminal Vss2 of the chip 40 is connected to a low-potential terminal of a −2.0 V D.C. power supply source, which has high-potential terminal that is grounded. An ammeter Iout is connected between the output terminal OUT and the power supply terminal Vss2. Vo denotes a voltage between the output terminal OUT and the ground.

The present invention is not limited to the specifically disclosed embodiments, and variations and modifications may be made without departing from the scope of the present invention.

What is claimed is:

1. An interface circuit provided between a compound semiconductor logic circuit and a bipolar transistor circuit, said interface circuit comprising:
   input buffer means for receiving an input signal from the compound semiconductor logic circuit and for outputting a buffered input signal;
   output driving means, operatively coupled to said input buffer means, for generating a drive signal from said buffered input signal;
   an output transistor having a gate connectable to receive said drive signal, a first terminal connectable to receive a first power supply voltage, and a second terminal,
   an output terminal connected to said second terminal of said output transistor and said bipolar transistor circuit; and
   output level adjustment means, comprising a first Schottky barrier transistor having a gate, a first terminal connected to the gate of said first Schottky barrier transistor and the gate of said output transistor, and a second terminal, for generating a constant voltage and applying the constant voltage to the second terminal of said first Schottky barrier transistor and wherein said output level adjustment means further comprises a first level shift element having a first terminal coupled to said first power supply voltage and a second terminal coupled to the second terminal of said first Schottky barrier transistor.

2. An interface circuit provided between a compound semiconductor logic circuit and a bipolar transistor circuit, said interface circuit comprising:
   input buffer means for receiving an input signal from the compound semiconductor logic circuit and for outputting a buffered input signal;
   output driving means, operatively coupled to said input buffer means, for generating a drive signal from said buffered input signal;
   an output transistor having a gate connectable to receive said drive signal, a first terminal connectable to receive a first power supply voltage, and a second terminal;
   an output terminal connected to said second terminal of said output transistor and said bipolar transistor circuit; and
   output level adjustment means, comprising a first Schottky barrier transistor having a gate, a first terminal connected to the gate of said first Schottky barrier transistor and the gate of said output transistor, and a second terminal, for generating a constant voltage and applying the constant voltage to the second terminal of said first Schottky barrier transistor, and wherein said output level adjustment means further comprises:
   a first level shift element having a first terminal connectable to receive said first power supply voltage, and a second terminal; and
   a second Schottky barrier transistor having a gate connectable to receive a second power supply voltage lower than said first power supply voltage, a first terminal connected to the second terminal of said first level shift element and the second terminal of said first Schottky barrier transistor, and a second terminal connectable to receive said second power supply voltage.

3. An interface circuit as claimed in claim 2, wherein said output level adjustment means further comprises protection means for preventing a reverse current from passing through said second and first Schottky barrier transistors so that said first Schottky barrier transistor is prevented from being damaged due to said reverse current.

4. An interface circuit as claimed in claim 2, wherein:
   said first Schottky barrier transistor is an enhancement type field effect transistor; and
   said second Schottky barrier transistor is a depletion type field effect transistor.

5. An interface circuit as claimed in claim 2, wherein said first level shift element comprises a level shift diode.

6. An interface circuit as claimed in claim 2, wherein said output level adjustment means further comprises a capacitor having a first terminal connected to the gate of said output transistor, and a second terminal connectable to receive said second power supply voltage.

7. An interface circuit as claimed in claim 2, wherein said output driving mean further comprises:
   a third Schottky barrier transistor having a first terminal connectable to receive said first power supply voltage, a second terminal and a gate connected to said second terminal of said third Schottky barrier transistor and the gate of said output transistor;
   a fourth Schottky barrier transistor having a first terminal connected to the gate of said output transistor, a gate connected to the first terminal of said fourth Schottky barrier transistor, and a second terminal; and
   a fifth Schottky barrier transistor having a first terminal connected to the second terminal of said fourth Schottky barrier transistor, a second terminal connectable to receive said second power supply voltage, and a gate connectable to receive said buffered input signal.

8. An interface circuit as claimed in claim 3, wherein said protection means comprises a first diode having an anode, connected to the second terminal of said first Schottky barrier transistor, and a cathode, connected to the first terminal of said second Schottky barrier transistor.

9. An interface circuit as claimed in claim 8, wherein said protection means further comprises a second diode, having an anode connected to the second terminal of said first level shift element, and a cathode, connected to the first terminal of said second Schottky barrier transistor.

10. An interface circuit as claimed in claim 9, wherein said output level adjustment means comprises a capacitor having a first terminal connected to the gate of said output transistor, and a second terminal connectable to receive said second power supply voltage.

11. An interface circuit provided between a compound semiconductor logic circuit and a bipolar transistor circuit, said interface circuit comprising:
   input buffer means for receiving an input signal from the compound semiconductor logic circuit and for outputting a buffered input signal;
   output driving means, operatively coupled to said input buffer means, for generating a drive signal from said buffered input signal;
   an output transistor having a gate connectable to receive said drive signal, a first terminal connectable to receive a first power supply voltage, and a second terminal;
   an output terminal connected to said second terminal of said output transistor and said bipolar transistor circuit; and
   output level adjustment means, comprising a first Schottky barrier transistor having a gate, a first terminal connected to the gate of said first Schottky barrier transistor and the gate of said output transistor, and a second terminal, for generating a constant voltage and applying the constant voltage to the second terminal of said first Schottky barrier transistor wherein said output level adjustment means further comprises means, connectable to receive said first power supply voltage and a second power supply voltage lower than said first power supply voltage, for generating said constant voltage from said first power supply voltage and said second power supply voltage and wherein said output level adjustment means further comprises a first level shift element having a first terminal coupled to said first power supply voltage and a second terminal connected to the second terminal of said first Schottky barrier transistor.

12. An interface circuit as claimed in claim 11, wherein said input buffer means is connected so that said input buffer means receives said first power supply voltage and a third power supply voltage lower than said first power supply voltage.

13. An interface circuit as claimed in claim 11, wherein said input buffer means is connected so that said input buffer means receives said first power supply voltage and said second power supply voltage.

14. An interface circuit as claimed in claim 11, further comprising level shifting means, connectable to receive said first power supply voltage and said second power supply voltage, for receiving said buffered input signal and for generating a level-shifted signal from said buffered input signal, said level-shifted signal being applied to said output driving means.

15. An interface circuit as claimed in claim 14, wherein said level shifting means comprises:
   a second Schottky barrier transistor having a first terminal connected to receive said first power supply voltage, a second terminal, and a gate connectable to receive said buffered input signal;
   a level shift diode having an anode connected to the second terminal of said second Schottky barrier transistor, and a cathode connected to said output driving means; and
   a fourth Schottky barrier transistor having a first terminal connected to the cathode of said level shift diode, a second terminal connectable to receive said second power supply voltage, and a gate connectable to receive said second power supply voltage.

16. An interface circuit as claimed in claim 13, wherein said input buffer means comprises:
   a second Schottky barrier transistor having a first terminal connectable to receive said first power supply voltage, a gate and a second terminal connected to the gate of said second Schottky barrier transistor;
   a third Schottky barrier transistor having a first terminal connected to the second terminal of said second Schottky barrier transistor, a second terminal connectable to receive said second power supply voltage, and a gate correctable to receive said input signal;
   a fourth Schottky barrier transistor having a gate connected to the second terminal of said second Schottky barrier transistor, a first terminal connectable to receive said first power supply voltage, and a second terminal connected to said output driving means; and
   a fifth Schottky barrier transistor having a first terminal connected to the second terminal of said fourth Schottky barrier, a second terminal connectable to receive said second power supply voltage, and a gate connectable to receive said second power supply voltage.

17. An interface circuit as claimed in claim 1, further comprising super buffer means, connected between said input buffer means and the gate of said output transistor, for driving said output transistor in response to said buffered input signal together with said output driving means.

18. An interface circuit as claimed in claim 1, further comprising protection means for preventing a reverse current from passing through said output transistor.

19. An interface circuit as claimed in claim 1, wherein said output transistor is a Schottky barrier field effect transistor.

20. An interface circuit as claimed in claim 1, wherein said output terminal is connected to an emitter coupled logic circuit.

* * * * *

UNITED STATES PATENT AND TRADEMARK OFFICE
CERTIFICATE OF CORRECTION

PATENT NO. : 5,159,208
DATED : October 27, 1992
INVENTOR(S) : Yoshiaki KANEKO

It is certified that error appears in the above-indentified patent and that said Letters Patent is hereby corrected as shown below:

Col. 1, line 37, delete "of";
line 63, change "though" to --through--.

Col. 4, line 54, change "A" to --An--.

Col. 6, line 64, change "signals" to --signal--.

Col. 12, line 30, change "correctable" to --connectable--.
line 40, after "barrier" insert --transistor--.

Signed and Sealed this

Tenth Day of May, 1994

Attest:

BRUCE LEHMAN

Attesting Officer

Commissioner of Patents and Trademarks